(12) United States Patent
Wang et al.

(10) Patent No.: US 9,711,201 B1
(45) Date of Patent: Jul. 18, 2017

(54) RECONFIGURABLE AND WRITABLE MAGNETIC CHARGE CRYSTALS

(71) Applicants: UChicago Argonne, LLC, Chicago, IL (US); BOARD OF TRUSTEES OF NORTHERN ILLINOIS UNIVERSITY, DeKalb, IL (US)

(72) Inventors: Yong-Lei Wang, Westmont, IL (US); Zhi-Li Xiao, Naperville, IL (US); Wai-Kwong Kwok, Downers Grove, IL (US)

(73) Assignees: UCHICAGO ARGONNE, LLC, Chicago, IL (US); BOARD OF TRUSTEES OF NORTHERN ILLINOIS UNIVERSITY, Dekalb, IL (US)

( * ) Notice: Subject to any disclaimer, the term of this patent is extended or adjusted under 35 U.S.C. 154(b) by 0 days.

(21) Appl. No.: 15/280,915

(22) Filed: Sep. 29, 2016

Related U.S. Application Data

(60) Provisional application No. 62/338,970, filed on May 19, 2016.

(51) Int. Cl.
*G11C 11/00* (2006.01)
*G11C 13/00* (2006.01)
(Continued)

(52) U.S. Cl.
CPC ............ *G11C 11/161* (2013.01); *B82Y 10/00* (2013.01); *B82Y 30/00* (2013.01); *G03F 7/039* (2013.01);
(Continued)

(58) Field of Classification Search
CPC ..... G11C 11/14; G11C 11/56; G11C 11/5607; G03F 7/039; G03F 7/2053; B82Y 10/00; B82Y 30/00
(Continued)

(56) References Cited

U.S. PATENT DOCUMENTS 7,488,819 B2 * 2/2009 Manabe ................. B82Y 10/00
540/472
8,085,578 B2 * 12/2011 Heyderman ............ G11C 11/14
365/129

(Continued)

OTHER PUBLICATIONS

Amlani et al., Digital Logic Gate Using Quantum-Dot Cellular Automata, Apr. 9, 1999, 4 pages.
(Continued)

*Primary Examiner* — Gene Auduong
(74) *Attorney, Agent, or Firm* — Foley & Lardner LLP

(57) ABSTRACT

Artificial ices enable the study of geometrical frustration by design and through direct observation. It has, however, proven difficult to achieve tailored long-range ordering of their diverse configurations, limiting both fundamental and applied research directions. An artificial spin structure design is described that produces a magnetic charge ice with tunable long-range ordering of eight different configurations. A technique is also developed to precisely manipulate the local magnetic charge states and demonstrate write-read-erase multi-functionality at room temperature. This globally reconfigurable and locally writable magnetic charge ice provides a setting for designing magnetic monopole defects, tailoring magnetics and controlling the properties of other two-dimensional materials.

20 Claims, 13 Drawing Sheets

(51) Int. Cl.
G11C 11/16 (2006.01)
G03F 7/039 (2006.01)
G11C 11/56 (2006.01)
B82Y 10/00 (2011.01)
G11C 11/14 (2006.01)
B82Y 30/00 (2011.01)

(52) U.S. Cl.
CPC .......... *G11C 11/14* (2013.01); *G11C 11/1673* (2013.01); *G11C 11/1675* (2013.01); *G11C 11/56* (2013.01)

(58) Field of Classification Search
USPC ........ 365/151, 129, 244, 148, 158; 430/296, 430/311, 326, 942
See application file for complete search history.

(56) References Cited

U.S. PATENT DOCUMENTS

| | | | | |
|---|---|---|---|---|
| 8,415,086 | B2* | 4/2013 | Heyderman | B82Y 10/00 365/151 |
| 8,450,047 | B2* | 5/2013 | Heyderman | B82Y 10/00 365/151 |
| 2012/0263648 | A1* | 10/2012 | Shapiro | A61K 47/48092 424/9.1 |

OTHER PUBLICATIONS

Anghinolfi et al., Thermodynamic Phase Transitions in a Frustrated Magnetic Metamaterial, Sep. 21, 2015, 6 pages.
Bardea et al., Magnetolithography: From Bottom-Up Route to High Throughput**, 2009, 4 pages.
Branford et al., Emerging Chirality in Artificial Spin Ice, Mar. 30, 2012, 5 pages.
Budrikis et al., Disorder Strength and Field-Driven Ground State Domain Formation in Artificial Spin Ice: Experiment, Simulation, and Theory, Jul. 17, 2012, 5 pages.
Budrikis et al., Vertex Dynamics in Finite Two-Dimensional Square Spin Ices, Aug. 3, 2010, 4 pages.
Castelnovo et al., Magnetic Monopoles in Spin Ice, Jan. 3, 2008, 4 pages.
Chern et al., Degeneracy and Criticality from Emergent Frustration in Artificial Spin Ice, Oct. 22, 2013, 5 pages.
Farhan et al., Direct Observation of Thermal Relaxation in Artificial Spin Ice, Aug. 2, 2013, 5 pages.
Gilbert et al, Emergent Ice Rule and Magnetic Charge Screening From Vertex Frustration in Artificial Spin Ice, Aug. 3, 2014, 6 pages.
Gilbert et al., Emergent Reduced Dimensionality by Vertex Frustration in Artificial Spin Ice, Oct. 26, 2015, 5 pages.
Heyderman et al., Artificial Ferroic Systems: Novel Functionality from Structure, Interactions and Dynamics, 2003, 29 pages.
Heyderman, Crystal-Clear Order, Oct. 2013, 2 pages.
Imre et al., Majority Logic Gate for Magnetic Quantum-Dot Cellular Automata, Jan. 13, 2006, 5 pages.
Kapaklis et al., Thermal Fluctuations in Artificial Spin Ice, Jun. 8, 2014, 6 pages.
Ke et al., Energy Minimization and ac Demagnetization in a Nanomagnet Array, Jul. 17, 2008, 4 pages.
Krawczyk et al., Review and Prospects of Magnonic Crystals and Devices with Reprogrammable Band Structure, Mar. 6, 2014, 32 pages.
Ladak et al., Direct Observation of Magnetic Monopole Defects in an Artificial Spin-Ice System, Apr. 11, 2010, 5 pages.
Latimer et al., Realization of Artificial Ice Systems for Magnetic Vortices in a Superconducting MoGe Thin Film with Patterned Nanostructures, Aug. 5, 2013, 5 pages.
Libal et al., Creating Artificial Ice States Using Vortices in Nanostructured Superconductors, Jun. 12, 2009, 4 pages.
Libal et al., Realizing Colloidal Artificial Ice on Arrays of Optical Traps, Nov. 30, 2006, 4 pages.
Mengotti et al., Real-space Observation of Emergent Magnetic Monopoles and Associated Dirac Strings in Artificial Kagome Spin Ice, Oct. 17, 2010, 7 pages.
Moller et al., Magnetic Multipole Analysis of Kagome and Artificial Spin-Ice Dipolar Arrays, Oct. 22, 2009, 4 pages.
Morgan et al., Thermal Ground-State Ordering and Elementary Excitations in Artificial Magnetic Square Ice, Nov. 28, 2010, 5 pages.
Nisoli et al, Ground State Lost but Degeneracy Found: The Effective Thermodynamics of Artificial Spin Ice, May 23, 2007, 4 pages.
Nisoli et al., Colloquium: Artificial Spin Ice: Designing and Imaging Magnetic Frustration, Oct. 2, 2013, 18 pages.
Nisoli et al., Effective Temperature in an Interacting Vertex System: Theory and Experiment on Artificial Spin Ice, Jul. 23, 2010, 4 pages.
OOMMF User's Guide, Sep. 28, 2012, 246 pages.
Phatak et al., Nanoscale Structure of the Magnetic Induction at Monopole Defects in Artificial Spin-Ice Lattices, May 18, 2011, 5 pages.
Remhof et al., Magnetostatic Interactions on a Square Lattice, Apr. 3, 2008, 6 pages.
Schumann et al., Charge Ordering of Magnetic Dipoles in Artificial Honeycomb Patterns, Jul. 15, 2010, 3 pages.
Singha et al., Two-Dimensional Mott-Hubbard Electrons in an Artificial Honeycomb Lattice, Jun. 3, 2011, 5 pages.
Taillefumier et al., Graphene in a Periodically Alternating Magnetic Field: An Unusual Quantization of the Anomalous Hall Effect, Aug. 25, 2011, 5 pages.
Trastoy et al., Freezing and Thawing of Artificial Ice by Thermal Switching of Geometric Frustration in Magnetic Flux Lattices, Aug. 17, 2014, 6 pages.
Wang et al., Artificial 'Spin Ice' in a Geometrically Frustrated Lattice of Nanoscale Ferromagnetic Islands, Jan. 19, 2016, 5 pages.
Wang et al., Rewritable Artificial Magnetic Charge Ice, May 20, 2016, 18 pages.
Ye et al., Electrons in a Periodic Magnetic Field Induced by a Regular Array of Micromagnets, Apr. 10, 1995, 5 pages.
Zhang et al., Crystallites of Magnetic Charges in Artificial Spin Ice, Aug. 29, 2013, 5 pages.

* cited by examiner

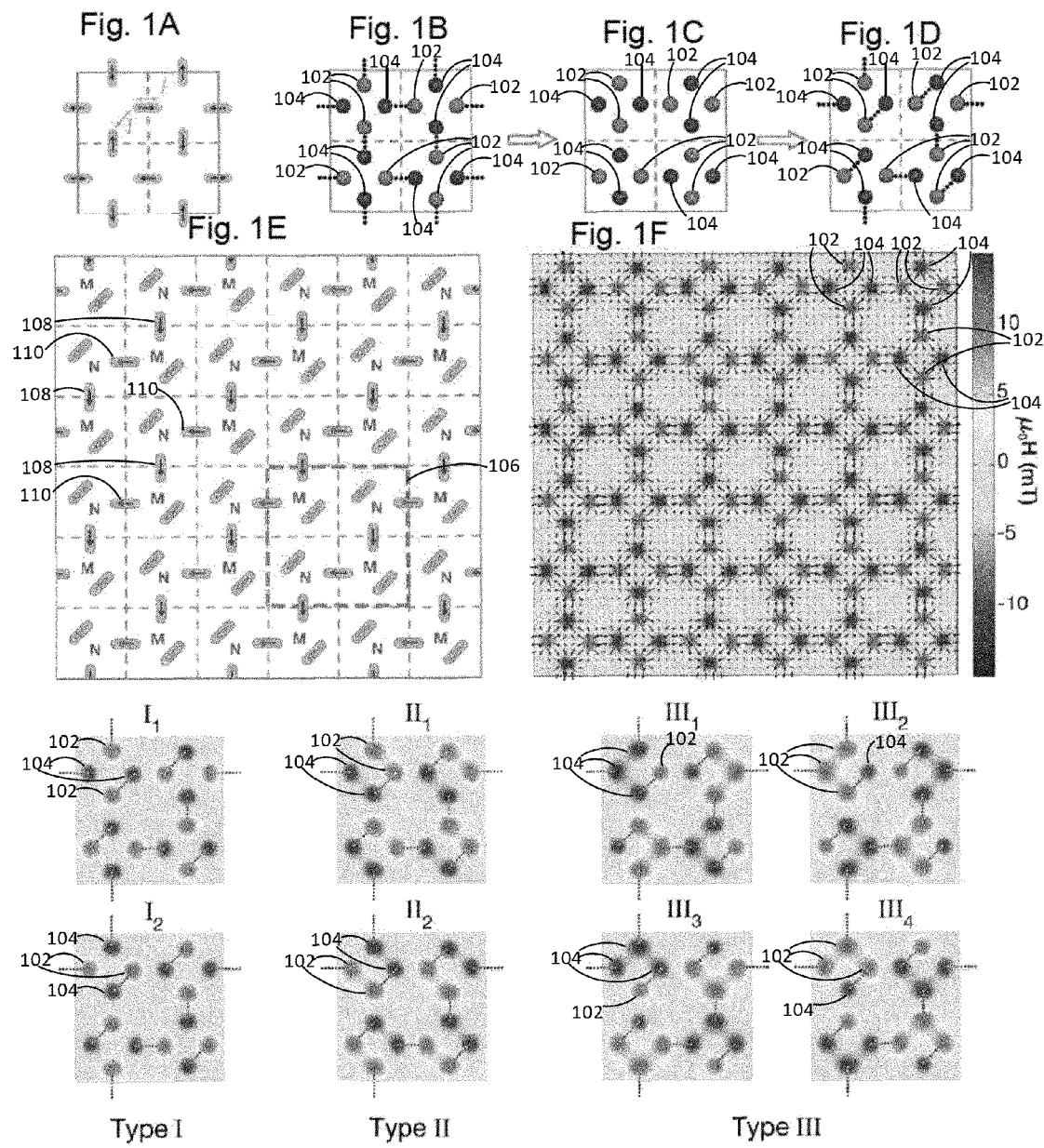

Fig. 2A
Fig. 2B  I₁ 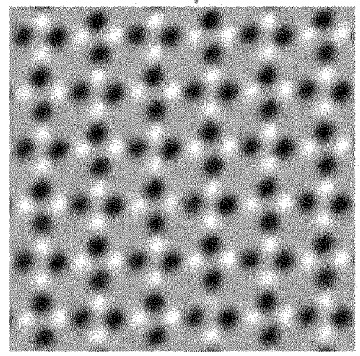
Fig. 2C  I₂ 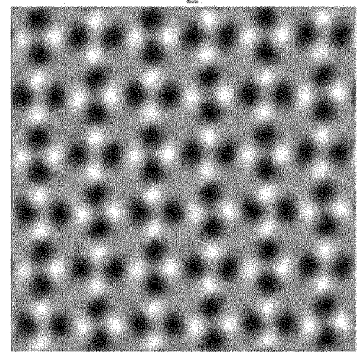
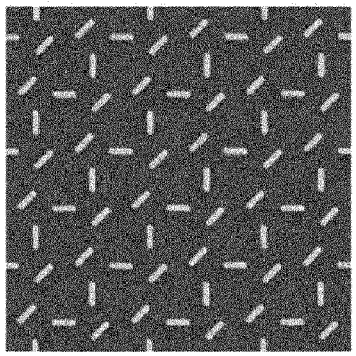
Fig. 2D  II₁ 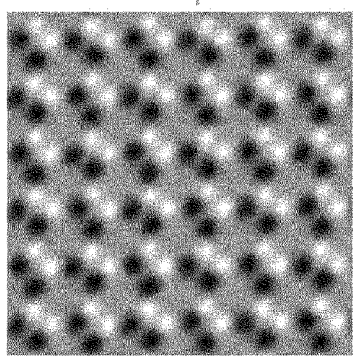
Fig. 2E  II₂ 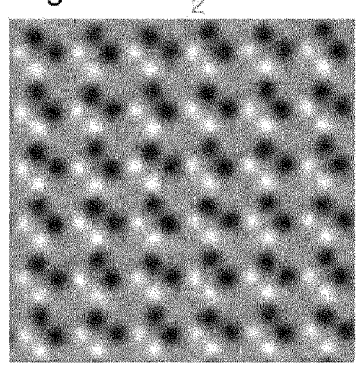
Fig. 2F  III₁ 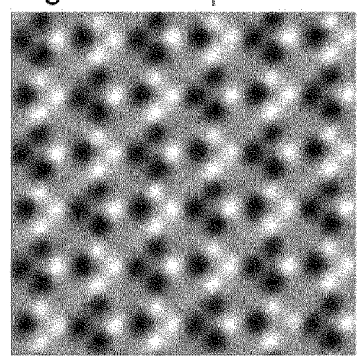
Fig. 2G  III₂ 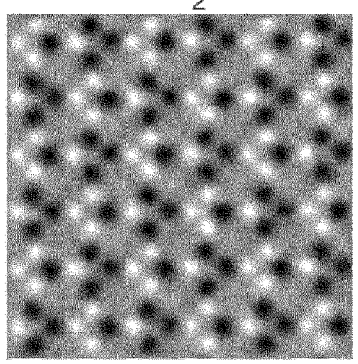
Fig. 2H  III₃ 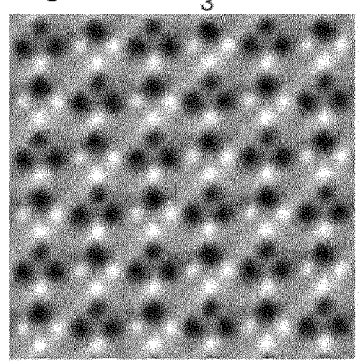
Fig. 2I  III₄ 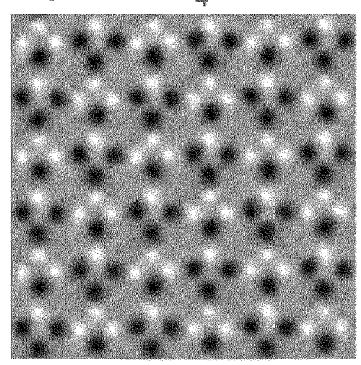
2 μm Fig. 3A
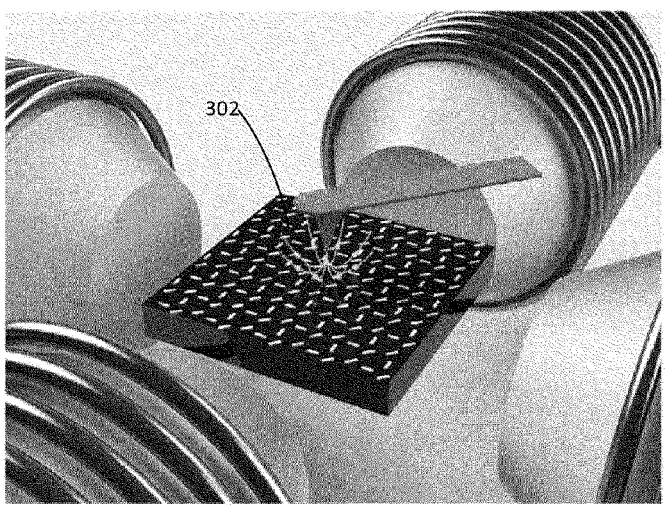
Fig. 3B
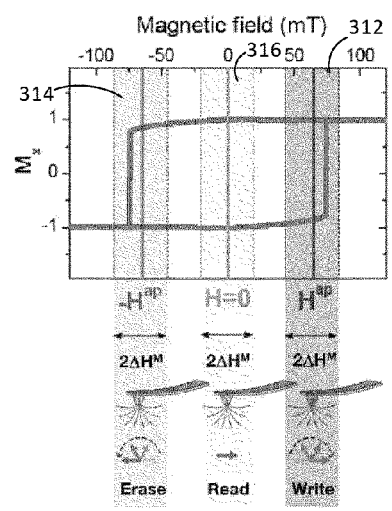
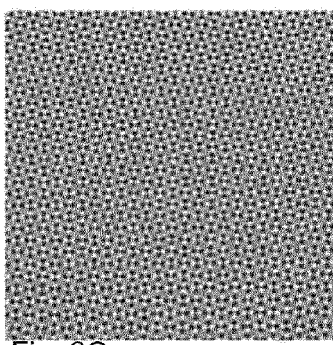
Fig. 3C
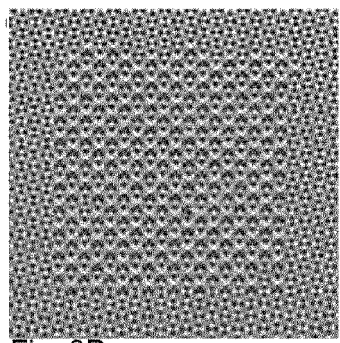
Fig. 3D
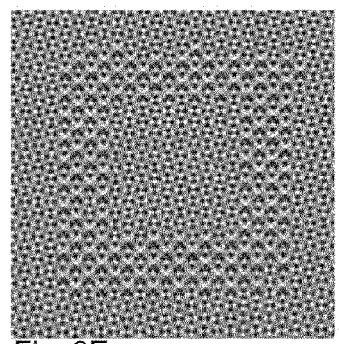
Fig. 3E
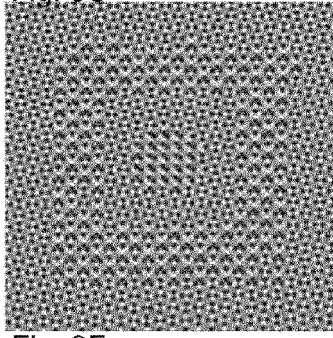
Fig. 3F
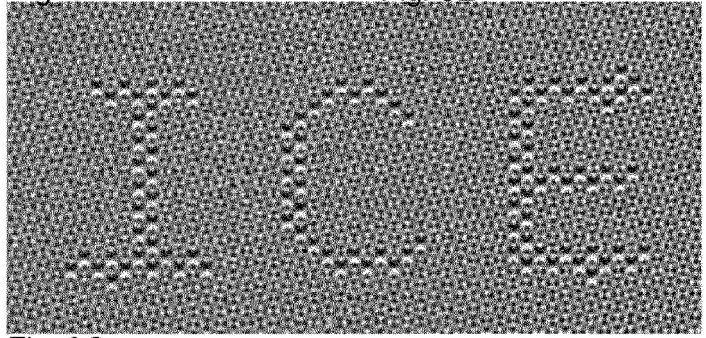
Fig. 3G
———— 10 μm

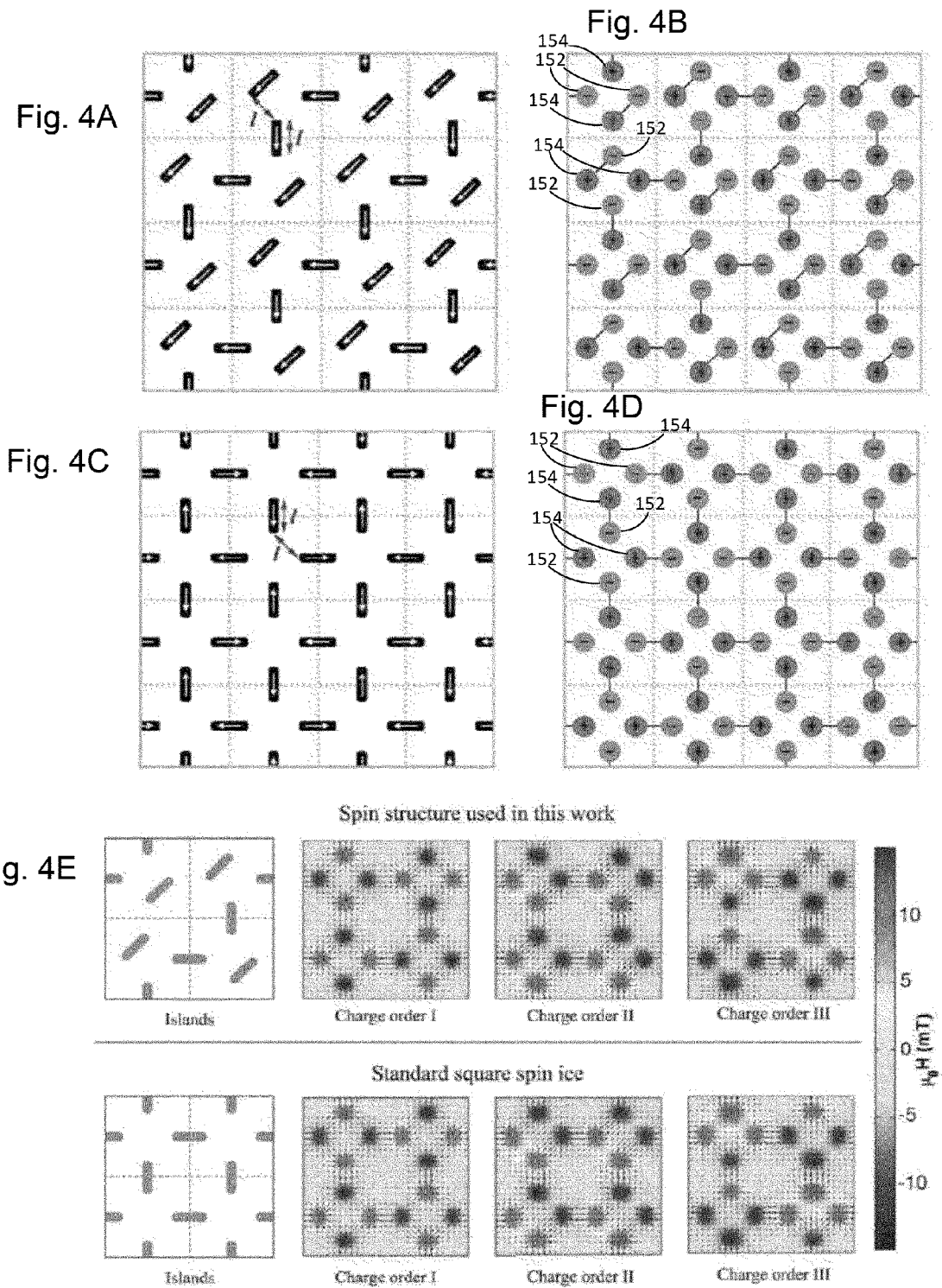

Fig. 9A
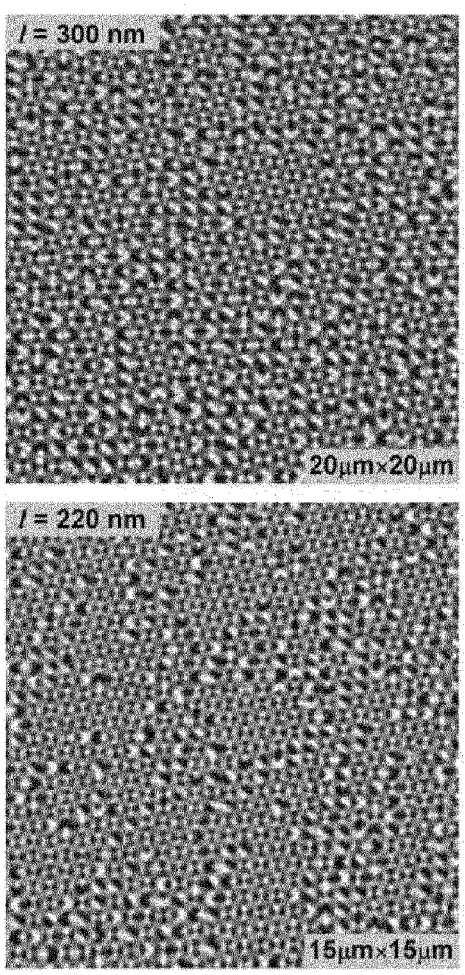
Fig. 9B
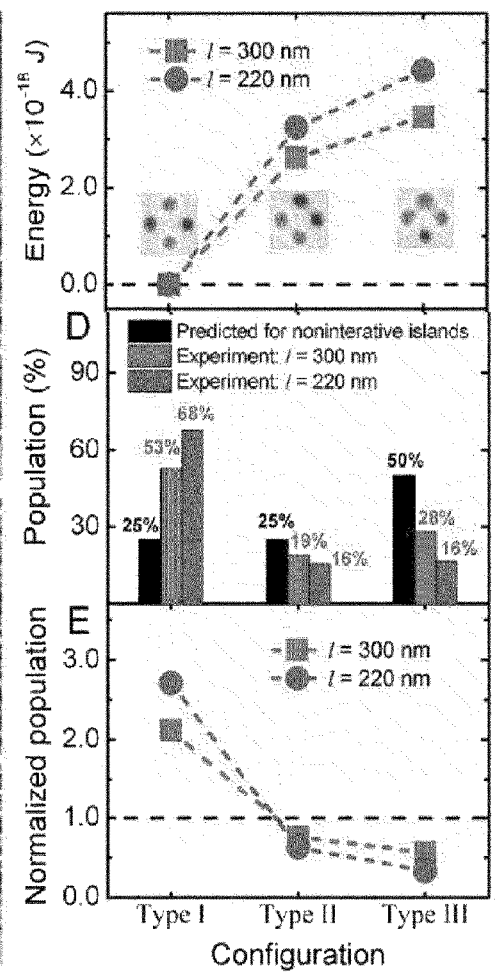
Fig. 9C
Fig. 9D
Fig. 9E

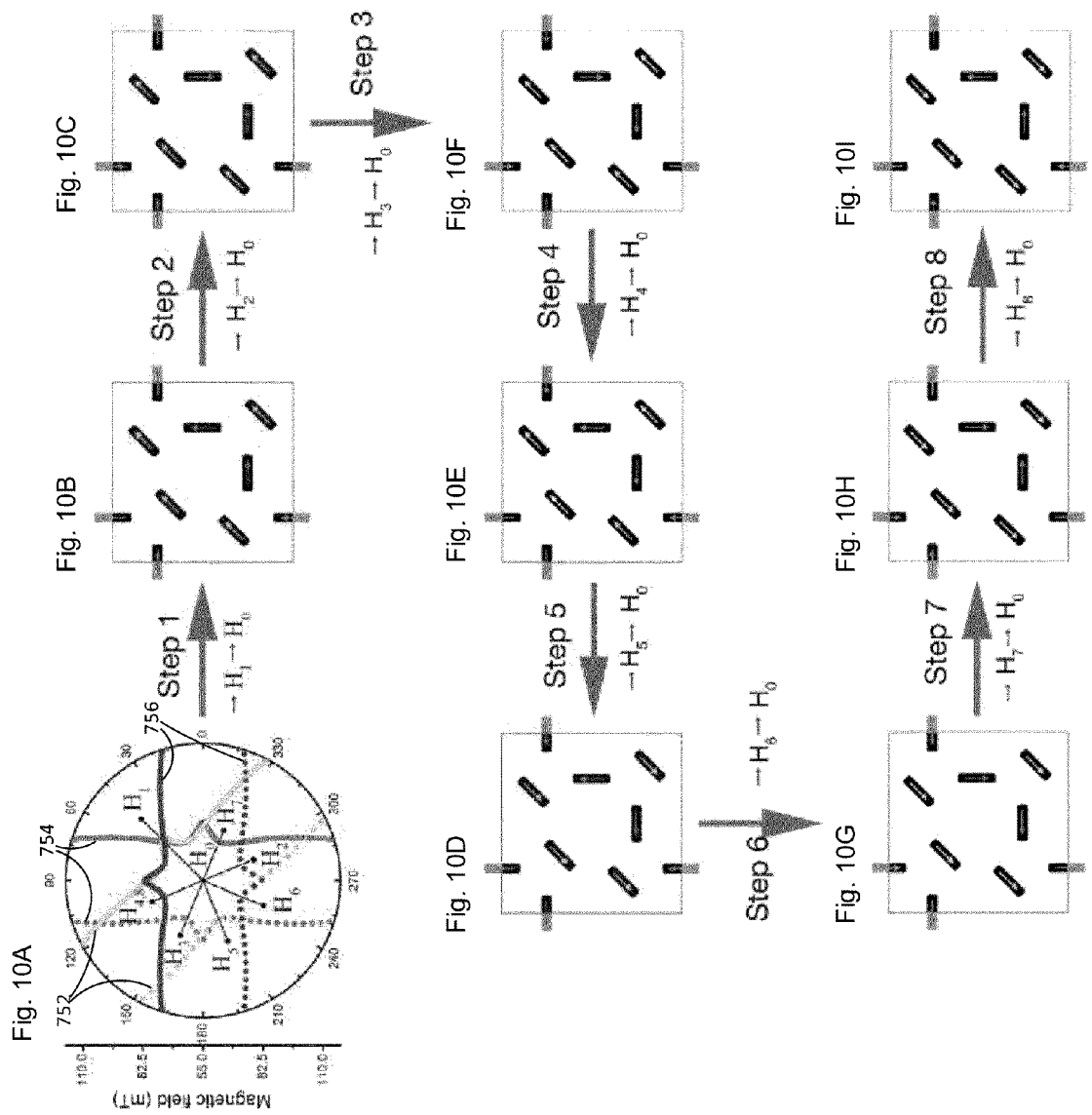

Fig. 11A  ANL
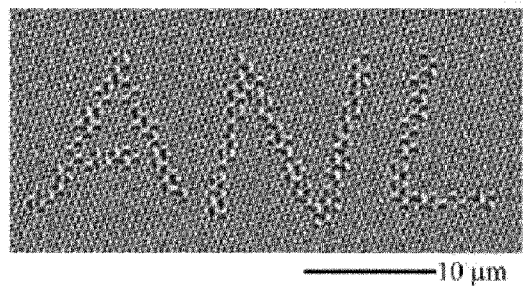
Fig. 11B  ND
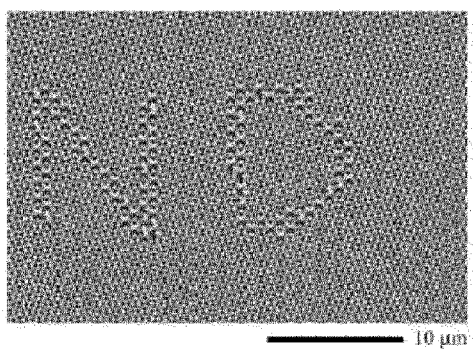
Fig. 11C  Partially erased "ND"
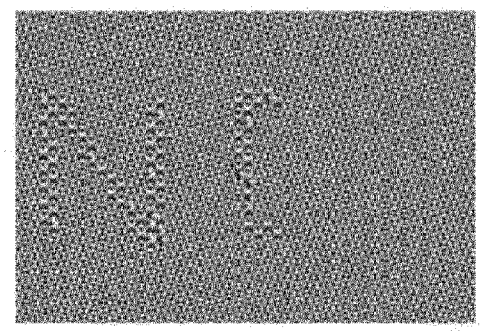
Fig. 11E  NIU
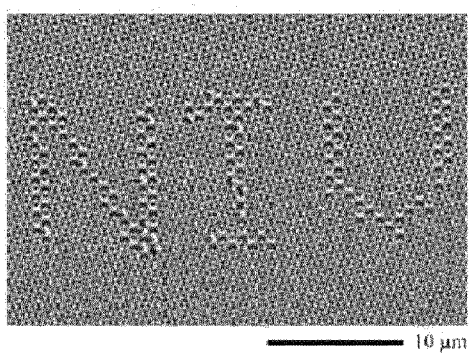
Fig. 11D  NI
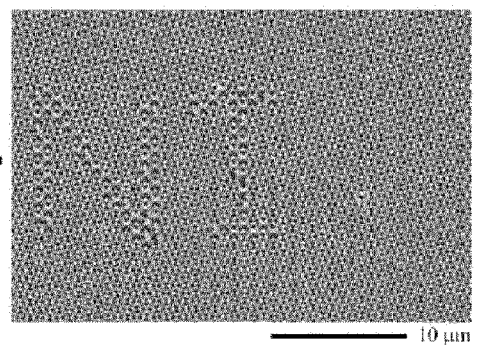

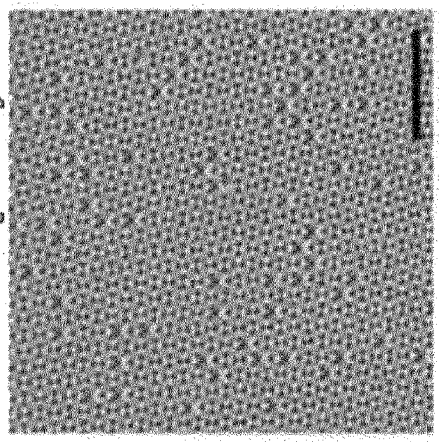
Fig. 12C 65 mT along 292 degree
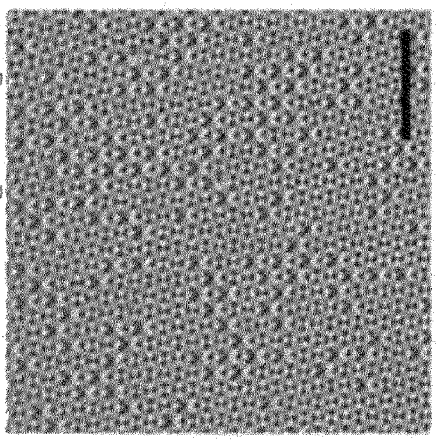
Fig. 12D 67.5 mT along 292 degree
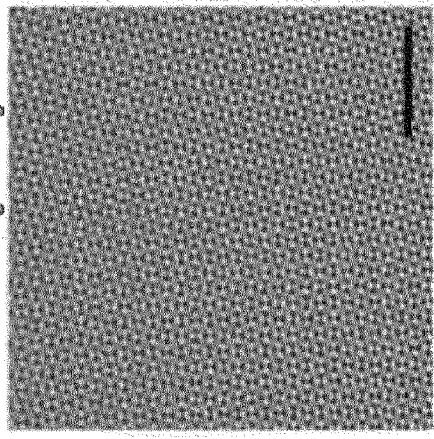
Fig. 12B 90 mT along 45 degree
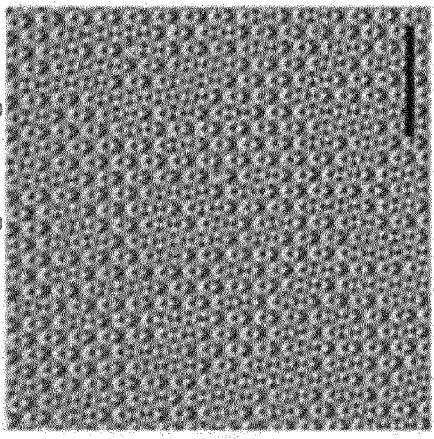
Fig. 12E 70 mT along 292 degree
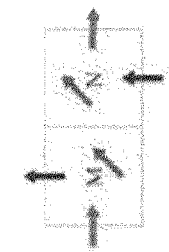 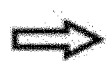 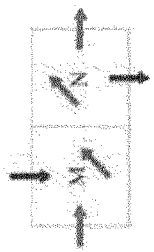
Fig. 12A Type I₂ → Type III₄
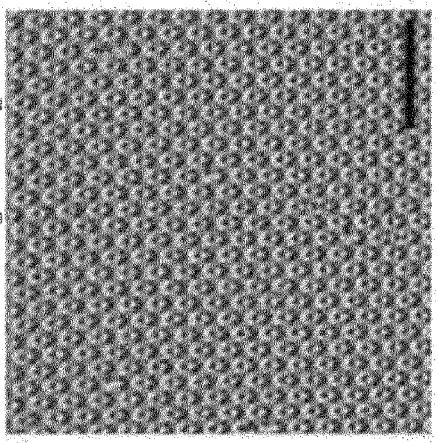
Fig. 12F 80 mT along 292 degree

RECONFIGURABLE AND WRITABLE MAGNETIC CHARGE CRYSTALS

STATEMENT OF GOVERNMENT INTEREST

This invention was made with government support pursuant to Contract No. DE-AC02-06CH11357 between the United States Department of Energy and UChicago Argonne, LLC, as operator of Argonne National Laboratory, and under National Science Foundation Award No. DMR-1407175. The government has certain rights in the invention.

FIELD OF THE INVENTION

The present invention generally relates to magnetic charge ice.

BACKGROUND OF THE INVENTION

Artificial ices are structures in which the constituents obey analogues of the 'two-in two-out' Pauling's ice rule that determines the proton positional ordering in water ice; they provide a material-by-design approach to physical properties and functionalities. Artificial ice can be created from ferromagnetic islands and connected wires as well as from topological components such as superconducting vortices and from non-magnetic colloidal particles. Among them, artificial spin ice is the most investigated system that was first demonstrated in a square lattice of elongated interacting ferromagnetic nano-islands. In this case, the ice rule corresponds to two spins pointing inward and two pointing outward at the vertex of a square lattice. Extensive experiments have been conducted using various thermal and magnetization approaches to obtain ordered states of the spin ice. Long-range ordering was realized in the diagonally polarized magnetic state through the magnetization method. For the nominal ground state, sizeable domains and crystallites were obtained in as-grown samples, and larger domains were obtained in samples heated above their Curie temperatures (~500° C. for permalloy island analysis). At room temperature, long-range ordering of the ground state has only been achieved in ultrathin (3 nm thick) samples via thermal relaxation. Other spin/charge configurations have only been observed locally and at crystallite boundaries. The difficulty in creating tailored multiple ordered states limits the experimental investigation of the spin and magnetic charge dynamics that can emerge from/between the ordered states, especially for a thermally stable (athermal) sample at room temperature. This also hinders the potential applications of artificial ice for data storage, memory and logic devices, or as a medium for reconfigurable magnetics.

SUMMARY OF THE INVENTION

An artificial spin structure in which one can obtain multiple long-range orderings of a magnetic charge ice lattice at room temperature is described. Artificial ices enable the study of geometrical frustration by design and through direct observation. It has, however, proven difficult to achieve tailored long-range ordering of their diverse configurations, limiting both fundamental and applied research directions. An artificial spin structure design is described that produces a magnetic charge ice with tunable long-range ordering of eight different configurations. A technique is also developed to precisely manipulate the local magnetic charge states and demonstrate write-read-erase multi-functionality at room temperature. This globally reconfigurable and locally writable magnetic charge ice provides a setting for designing magnetic monopole defects, tailoring magnetics and controlling the properties of other two-dimensional materials.

Additional features, advantages, and embodiments of the present disclosure may be set forth from consideration of the following detailed description, drawings, and claims. Moreover, it is to be understood that both the foregoing summary of the present disclosure and the following detailed description are exemplary and intended to provide further explanation without further limiting the scope of the present disclosure claimed.

BRIEF DESCRIPTION OF THE DRAWINGS

The foregoing and other objects, aspects, features, and advantages of the disclosure will become more apparent and better understood by referring to the following description taken in conjunction with the accompanying drawings, in which:

FIGS. 1A-1G depict a design of magnetic charge ices according to an example implementation.

FIGS. 2A-2I depict a realization of magnetic charge ices according to an example implementation.

FIGS. 3A-3G depict rewritable magnetic charge ices according to an example implementation.

FIGS. 4A-4E depict distributions of the spins and magnetic charges in the designed artificial spin structure and an artificial square spin ice structure in an implementation.

FIGS. 9A-9E depict collective behavior of magnetic charge ice in one implementation.

FIGS. 10A-10I depict typical protocol steps to realize all the magnetic charge ordered states in one implementation.

FIGS. 11A-11E depict additional MFM images demonstrating the write/read/erase functions in one implementation FIGS. 12A-12F depict evolution of the magnetic charge phase transition from Type-I ordering to Type-III ordering in one implementation.

DETAILED DESCRIPTION OF THE FIGURES

Figure 5:
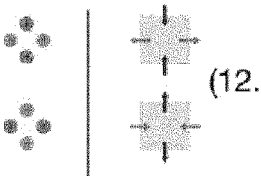
FIG. 5 depicts a comparison of the local charge and spin configurations of the artificial square spin ice and an implementation of the spin structure.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

Referring now to FIGS. 1A-1G, they depict a design of magnetic charge ices according to an example implementation. In brief, FIG. 1A depicts a typical artificial square spin ice in which the length of the magnetic nano-island equals the separation of the ends of the nearest islands. Each island is an Ising spin (black arrows). Shown is the spin configuration of the lowest energy ground state. FIG. 1B depicts a distribution of magnetic charges corresponding to the square spin ice shown in FIG. 1A. The pairing of the positive charges (lighter spots 102) and negative (darker spots 104) charges is indicated by black dotted lines. FIG. 1C depicts a distribution of magnetic charges with charge connections removed. FIG. 1D depicts a redesign of the connections of paired charges with positive and negative polarities. FIG. 1E depicts a design of the magnetic nano-structure based on FIG. 1D. The arrows indicate the spin configuration of the ground state and are color coded for the three subsets of islands placed in three different orientations. Two types of plaquettes are marked with M and N. FIG. 1F depicts a calculated magnetic stray field associated with the spin configuration of the structure in FIG. 1A for islands with dimensions 300 nm×80 nm×25 nm. The arrows indicate the local field directions. The color is encoded by the out-of-plane component of the field (lighter spots 102, out of the plane; darker spots 104, into the plane, a representative number labeled in FIG. 1A). The lighter spots 102 and darker spots 104 represent the positive and negative magnetic charges, respectively. FIG. 1G depicts calculated magnetic stray fields of a 2×2 square plaquette, highlighted by the dashed frame 106 in FIG. 1E, for the eight possible spin/charge ordered configurations, separated into three charge types. The dotted lines denote the orientation of the islands containing the pair of magnetic charges (negative charge: darker arrow 108; positive charge: lighter arrow 110, a representative number labeled in FIG. 1E). In order to compare the magnetic simulations with the experimental MFM images, the stray field is calculated at a plane 100 nm above the surface of the sample.

In a typical square spin ice, depicted in one implementation in FIG. 1A, the single domain magnetic islands are considered as macro Ising spins. Each 'macro-spin' can be replaced with a dumbbell of magnetic charges, one positive and one negative, depicted in one implementation in FIG. 1B. If connections between the pairs of magnetic charges with opposite signs are broken, depicted in one implementation in FIG. 1C, a different pattern of connections, depicted in one implementation in FIG. 1D can be designed. In one implementation, FIG. 1E shows the resulting artificial spin structure explicitly. The structure consists of a square lattice of plaquettes (labeled M and N) containing ferromagnetic nano-islands with three orientations (horizontal, vertical and diagonal). The magnetic charge distribution is indicated by the calculated stray field distribution, depicted in one implementation in FIG. 1F, which leads to a magnetic charge ice with the charge ice rule of 'two-negative two-positive' charges within each square plaquette.

The magnetic charge distribution in FIG. 1F as depicted is exactly the same as that of the ground state of a square spin ice structure (see FIG. 4). However, in contrast to the square spin ice, which has spins on four sides of the square plaquette and all oriented towards the plaquette center/vertex (depicted in one implementation in FIG. 1A), the structure in FIG. 1E places one spin within the plaquette while removing two from the sides, breaking the four-fold symmetry of a square lattice; moreover, the three spins associated with each plaquette do not meet at a vertex. In one implementation, there are two types of plaquettes, one rotated by 180° from the other, denoted as M and N in FIG. 1E. Each plaquette (M or N) consists of three islands, each with two degrees of freedom coming from spin, resulting in a total multiplicity of eight configurations of magnetic charges. See FIGS. 4 and 5 for detailed comparisons to the spin/charge configurations of a more standard square spin ice. The predicted eight ordered spin/charge configurations (FIG. 1G) are separated into three groups based on their energies (see the calculated energies in FIG. 6): a two-fold degenerate Type-I ground state ($I_1$ and $I_2$), a two-fold degenerate excited Type-II state ($II_1$ and $II_2$), and a four-fold degenerate excited Type-III state ($III_1$, $III_2$, $III_3$ and $III_4$) (FIG. 1G).

Because of the large energy barrier for the spins, the spin system, as depicted in one implementation in FIG. 1E, is athermal at room temperature. An external applied magnetic field can be used to overcome the energy barrier. For a given island, the minimal magnetic field required to flip its spin moment varies with the angle between the applied field and the island (FIG. 7). This enables separate control of the spin moments of each differently oriented island. In a square spin ice, there are two orientations of the islands and the spins can only be aligned in diagonal directions by an applied magnetic field, enabling only the Type-II phases with long-range ordering. In one implementation, as depicted in FIG. 1E, an additional freedom is provided for aligning the spins: there are three sets of islands orientated in the horizontal, vertical and diagonal directions. More importantly, for each of the predicted ordered states, shown in one implementation in FIG. 1G, the spin moments of each of the three oriented islands (horizontal, vertical or diagonal) are all magnetized in the same direction. This enables the creation of long-range ordering for all the predicted charge configurations by tuning the in-plane external magnetic field angle and amplitude. An effective magnetization protocol to realize the various ordered charge states can be designed by calculating the field angle dependence of the moment flipping curves for the three sets of islands as depicted in one implementation in FIG. 7C.

Fabricated arrays of permalloy ($Ni_{0.8}Fe_{0.2}$) nanoislands (300 nm long, 80 nm wide, and 25 nm thick) onto a $Si/SiO_2$ substrate (30) according to the design depicted in one implementation in FIG. 1E, can experimentally demonstrate the magnetic charge ordering.

FIGS. 2A-2I depict a realization of magnetic charge ices according to an example implementation. A scanning electron microscopy (SEM) image of the sample is presented in FIG. 2A as an implementation and depicts an SEM image of permalloy ($Ni_{80}Fe_{20}$) magnetic islands (300 nm long, 80 nm wide, and 25 nm thick). FIGS. 2B-2I depict an implementation of Magnetic Force Microscopy (MFM) images of the various ordered states corresponding to all the configurations, depicted in one implementation in FIG. 1G. FIGS. 2B-2C depict, in one implementation, two-fold degenerate Type-I ground states: FIG. 2B and $I_2$ FIG. 2C. FIGS. 2D-2E depict, in one implementation, two-fold degenerate excited Type-II states: $II_1$ FIG. 2D and $II_1$ FIG. 2E. FIGS. 2F-2I depict, in one implementation, four-fold degenerate excited Type-III states: $III_4$ FIG. 2F, $III_2$ FIG. 2G, $III_3$ FIG. 2H and $III_4$ FIG. 2I. The lift height of MFM scanning is 100 nm.

A customized magnetic force microscope (MFM) equipped with a 2D vector magnet can be used to control and visualize the charge configurations. FIG. 3A shows a schematic drawing of an implementation of the experimental setup. The 2D electromagnetic solenoid magnet provides in-plane magnetic fields in any desired orientation, enabling accurate tuning of the field angle and amplitude.

The as-grown samples, depicted in one implementation in FIG. 8 and demagnetized samples, depicted in one implementation in FIG. 9 show mixed charge states of all the eight charge configurations at both M and N plaquettes. Statistical analysis for the demagnetized samples shows that the charge neutral configurations (Type-I) are strongly favored and the collective interaction can be enhanced by reducing the charge separation (depicted in one implementation In FIG. 9). Using the designed magnetization protocol (depicted in one implementation in FIG. 10), all eight configurations of magnetic charge ordering can be successfully obtained, as depicted by the MFM images in FIG. 2B-I. Each of these ordered states possesses long-range ordering and can be reproduced over the entire patterned sample area (80×80 μm$^2$). For Type-I and Type-II ordered states, there is no net charge in each plaquette and the magnetic charge follows the "two-positive two-negative" charge ice rule. In the Type-Ill ordered states, each plaquette with magnetic charges of "three-positive (negative) one-negative (positive)" has an effective magnetic charge of two with opposite signs on the M and N plaquettes. This distribution of magnetic charges in the square lattice of the Type-Ill state resembles the distribution of electrical charges in ionic compounds, such as $Mg^{2+}O^{2-}$. Thus, the Type-III states (FIG. 2F-I) resemble an ionic crystal with magnetic charges (31) where the $M^{2+}N^{2-}$ can be associated with the Type-III$_2$ and Type-III$_4$ state and $M^{2-}n^{2+}$ with the Type-III$_1$ and Type-III$_3$ state. In principle, all these magnetic charge distributions could also exist in a square spin ice structure (depicted in one implementation in FIG. 4E and FIG. 5). In fact, micromagnetic simulation results indicate that the square spin ice and the engineered spin structure not only produce the same magnetic charge arrangements but also have the same excitation energies for the Type-I, II and III configurations (depicted in one implementation in FIG. 6). However, with the square spin ice arrangement, long range ordering of Type-I states has only been realized in thermally relaxed sample and that of the Type-III states has not yet been experimentally realized because of the spin arrangement of the islands.

The reconfigurable ordered magnetic charges can be used, for example, as templates to form other artificial ices such as superconducting vortex ices by introducing ice-like pinning potentials for superconducting vertices. It can also be applied to couple with other electronic materials, such as two-dimensional electron gas and graphene, by producing reconfigurable periodically distributed field potentials. For applications such as data storage, memory and logic devices, however, local control of the magnetic charge states is desired. Toward this end we developed a 2D magnetic field assisted MFM patterning technique, which allows us to conveniently manipulate the local charge configurations.

Referring now to FIG. 3, FIGS. 3A-3G depict rewritable magnetic charge ices according to an example implementation. In brief description of FIG. 3, FIG. 3A depicts a sketch of the experimental setup: a magnetic force microscope (MFM) equipped with a 2D vector magnet. The 2D solenoid magnet provides magnetic fields in any desired orientation in the sample plane. Vertically magnetized MFM probe generates stray magnetic field 302 with in-plane components at the tip. FIG. 3B depicts a magnetization loop of a single magnetic island with illustration of the 'write', 'erase' and 'read' functions. FIGS. 3C-G depict MFM images of the patterned magnetic charge ice at the same area of the sample: FIG. 3C initial state is a Type-I$_1$ state; FIG. 3D a square area of Type-III$_3$ state was written in the center of FIG. 3C; FIG. 3E a smaller square region of Type-III$_3$ order is 'erased' back to Type-I$_1$ state from FIG. 3D; FIG. 3F a round region of Type-II$_2$ order is 'written' onto the freshly 'erased' area from FIG. 3E; FIG. 3G 'ICE' letters of Type-III$_4$ states were scribed on a Type-I background state.

In further detail, as depicted in FIG. 3A, in some implementations, the magnetic tip of an MFM generates an in-plane component of stray magnetic fields near the tip. The interaction of the MFM tip's stray field, $\Delta H^m$, with a single ferromagnetic island can be tuned by adjusting the height of the MFM tip from the sample, which is 100 nm in this experiment. To locally switch the spin states of an island, an in-plane magnetic field $H^{ap}$ can be applied slightly below the ferromagnetic island's spin moment flipping field $H^f$ (depicted in one implementation in FIG. 3B). At this field value the spin states of the entire sample will not be altered since $H^{ap}<H^f$. When the MFM probe scans over an island, the total magnetic field on that island will change in the range $H^{ap}\pm\Delta H^m$. We adjust $H^{ap}$ and $\Delta H^m$ to satisfy the condition $H^{ap}<H^f<(H^{ap}+\Delta H^m)$ (region 312 in FIG. 3B). In this case, the spin of the underlying island flips when the MFM tip scans over it, providing a 'write' function. A subsequent applied magnetic field in the opposite direction with $-(H^{ap}+\Delta H^m)<-H^f<-(H^{ap}-\Delta H^m)$ (region 314 in FIG. 3B) will switch the spin back, implementing the 'erase' function (depicted in one implementation in FIG. 3B). When the applied field is zero, the stray field provided by the MFM probe (region 316 in FIG. 3B) is too small to flip any islands, and this works as the 'read' mode. Because the value of $H^f$ depends on the angle between the applied field and the island, similar to the global control of the charge ordering, the charge states can be locally manipulated into any desired configurations.

The experimental realization of the 'write', 'read' and 'erase' functions are demonstrated in FIGS. 3C-F in one implementation. The entire sample may be prepared in the Typed ground state (depicted in one implementation in FIG. 3C) by applying and zeroing an in-plane magnetic field of 90 mT along the diagonal direction. A square area of Type-III ordered state may be 'written' in the center (depicted in one implementation in FIG. 3D) and subsequently may be a smaller square area in the central area may be 'erased' by switching the Type-III state back into the Type-I state (depicted in one implementation in FIG. 3E). Finally, a Type-II state may be 'written' into a small circular area inside the Type-III square (depicted in one implementation in FIG. 3F). Letters can also be 'written', as presented in one implementation in FIG. 3G where the word 'ICE' is scribed with Type-III order on a Type-I background. Such magnetic charge patterning can be realized in some implementations by programming the 2D magnet to turn on/off and to switch the field directions during the MFM scanning, resembling the patterning process used in electron-beam lithography and in optical lithography using a laser pattern generator. More patterns of magnetic charge arrays are demonstrated in some implementations in FIG. 11. These rewritable magnetic charge patterns could be transferred to other materials, for example, through magnetolithography.

FIGS. 4A-4E depict, for some implementations, distributions of the spins and magnetic charges in the designed artificial spin structure and an artificial square spin ice structure. FIG. 4A and FIG. 4C illustrate the nanomagnet arrangements of the designed spin structure and a square spin ice structure, respectively. The nearest neighbor distance equals the length of the nanomagnets. The spins, indicated by arrows, in FIG. 4A and FIG. 4C correspond to the configurations in the ground states. FIG. 4B and FIG. 4D show the magnetic charge ice distributions associated with the spin arrangements in FIG. 4A and FIG. 4C, respectively. The darker spots 154 and lighter spots 152 (a representative sample of which are labeled in the figures) correspond to positive and negative magnetic charges respectively. The black lines in FIG. 4B and FIG. 4D, connecting pairs of positive and negative magnetic charges, mirror the islands in FIG. 4A and FIG. 4C, respectively. Calculated magnetic stray fields of a 2×2 square plaquette for both the designed spin structure (top panels) and the square spin ice structure (bottom panels) with three corresponding charge states (Type-I, Type-II and Type-III) in both structures. The arrows indicate the local field directions and are color coded with the out-of-plane component of the field (red, out of the plane; blue, into the plane). The darker spots 152 and lighter spots 154 represent the positive and negative magnetic charges, respectively. The magnetic charge distributions of the two structures are equivalent while their spin arrangements differ.

FIG. 5 depicts a comparison of the local charge and spin configurations of the artificial square spin ice and an implementation of the spin structure. The percentages indicate the expected fraction of each type in a non-interacting island array.

Figure 6A:
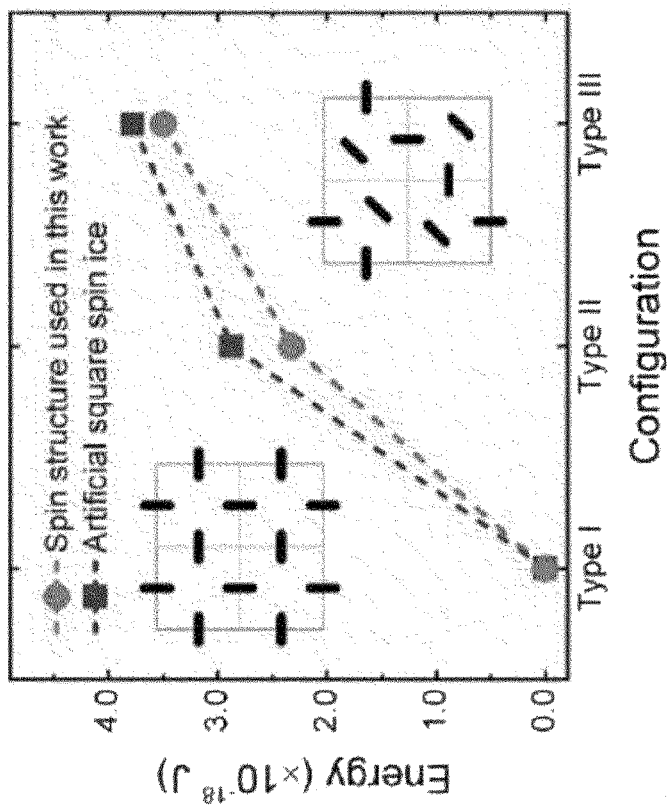
FIGS. 6A-6B depict calculated excitation energies of an artificial square spin ice and an implementation of the spin structure.
Figure 6B:
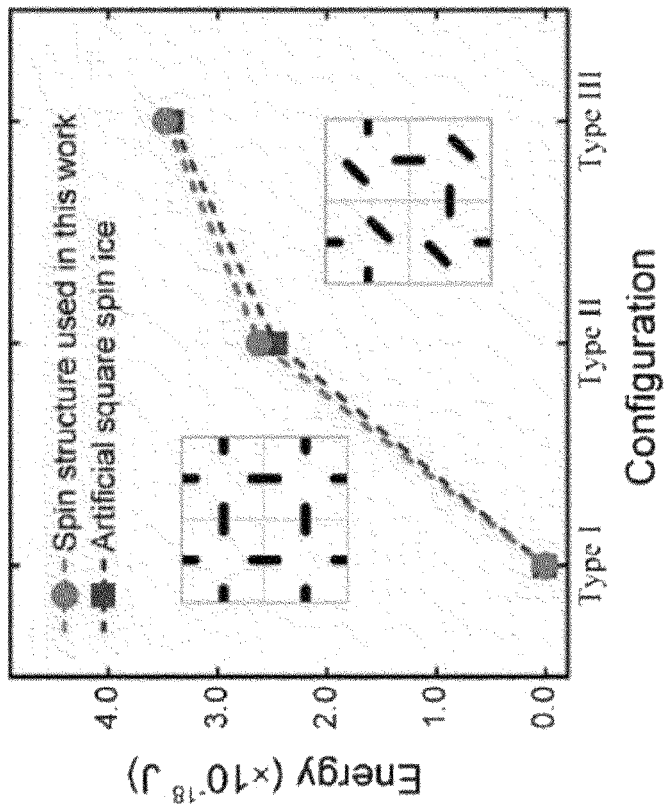

FIGS. 6A-6B depict calculated excitation energies of an artificial square spin ice and an implementation of the spin structure. FIG. 6A depicts an implementation for infinite-sized samples and FIG. 6B depicts an implementation for small samples with 2 by 2 lattices. The dimensions of the islands used in the calculation are 300 nm×80 nm×25 nm with round ends. Calculations were conducted using the islands shown in the insets in FIG. 6A and FIG. 6B. The calculations for infinite-sized samples in FIG. 6A are conducted under 2D periodic boundary condition.

Figure 7A:
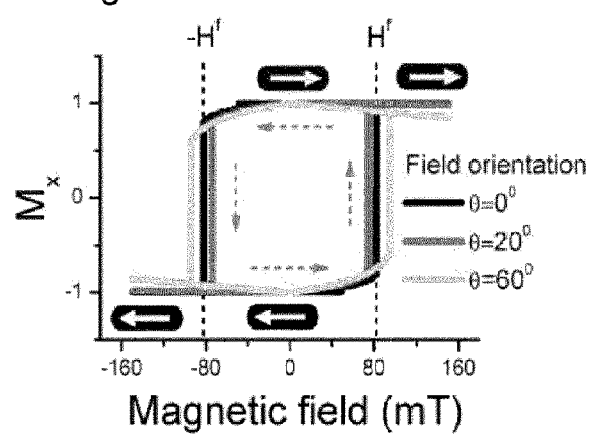
FIGS. 7A-7C depict angle dependence of the moment flipping fields of the magnetic islands in some implementations.
Figure 7B:
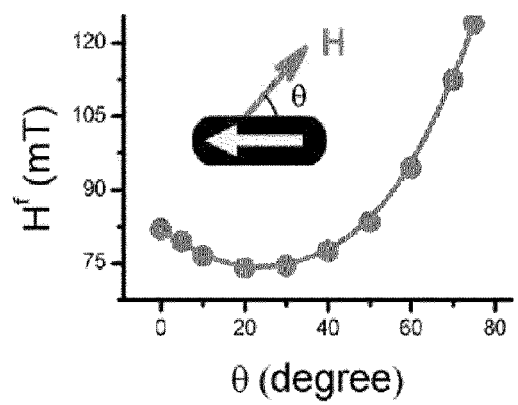
Figure 7C:
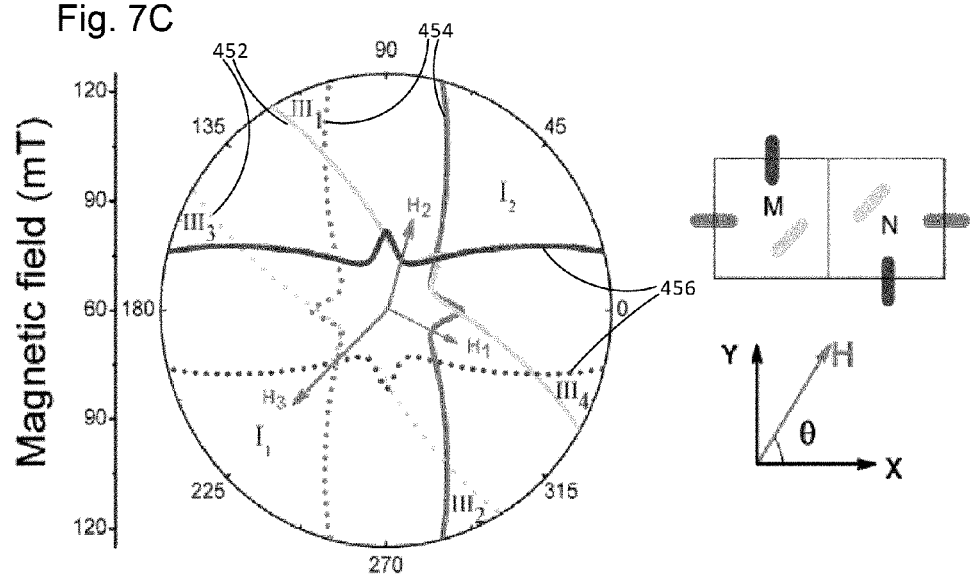

FIGS. 7A-7C depict angle dependence of the moment flipping fields of the magnetic islands in some implementations. FIG. 7A depicts calculated magnetization loop of a Py island (300 nm long, 80 nm wide and 25 nm thick) with fields along 0°, 20° and 60° with respect to the long axis of the island. $H^f$ is the minimum flipping field at $\theta=0°$, above which the spin reverses its direction. The dashed arrows indicate the field sweep directions. The spin directions of the islands at various applied fields are shown by the non-dashed arrows. FIG. 7B depicts angle dependence of the flipping/switching field $H^f$ curve. The inset shows the applied field direction with respect to the island. For a single 300 nm×80 nm×25 nm structure, the most effective field direction to flip the spin moment is approximately 22°, and can change with the dimensions of the nano-islands. FIG. 7C depicts polar plots of the angle dependences of the flipping magnetic fields of the three subsets of islands orientated horizontally (curves 454), vertically (curves 456) and diagonally (curves 452). Dotted curves and solid curves represent switching field values of the three oriented islands. The six flipping curves separate the field coordinate space into seventeen sections. For field vectors within the center star-region, the initial spin/charge configurations will not change. When the applied field vector crosses the flipping curves, the corresponding oriented islands flip their spin moment. For example, for field vector $H_1$, which crosses curve 454 (solid) flipping curve (for horizontal islands), the spins of the horizontal islands point to the right. Depending on the initial spin/charge states, the charge configuration can be Type-$I_2$, $II_2$, $III_2$ or $III_4$. For the field vector $H_2$, which crosses two flipping curves (for vertical and diagonal islands), the spins of the vertical and diagonal islands point up and up-right, respectively. The charge configuration can be either Type-$I_2$ or $III_1$, depending on the initial states of the spins in the horizontal islands. For field vector $H_3$, which crosses three flipping curves, there is only one charge configuration, Type-$I_1$, and in the figure we mark all such field regions with their corresponding charge configurations, which indicates that all the Type-I and Type-III states can be easily obtained through a single magnetization step. The realization of Type-II states depends on the initial charge states (see FIG. 10 for details on obtaining all the various charge ordered configurations).

Figure 8B:
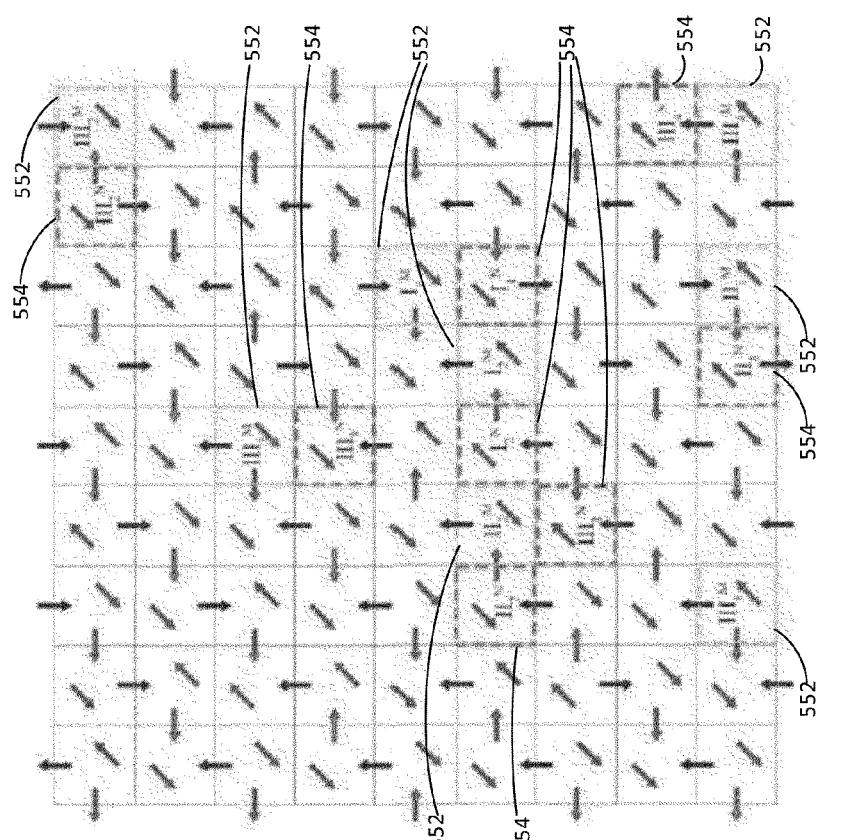
FIGS. 8A-8B depict magnetic charge/spin configurations of an as-grown sample in one implementation
Figure 8A:
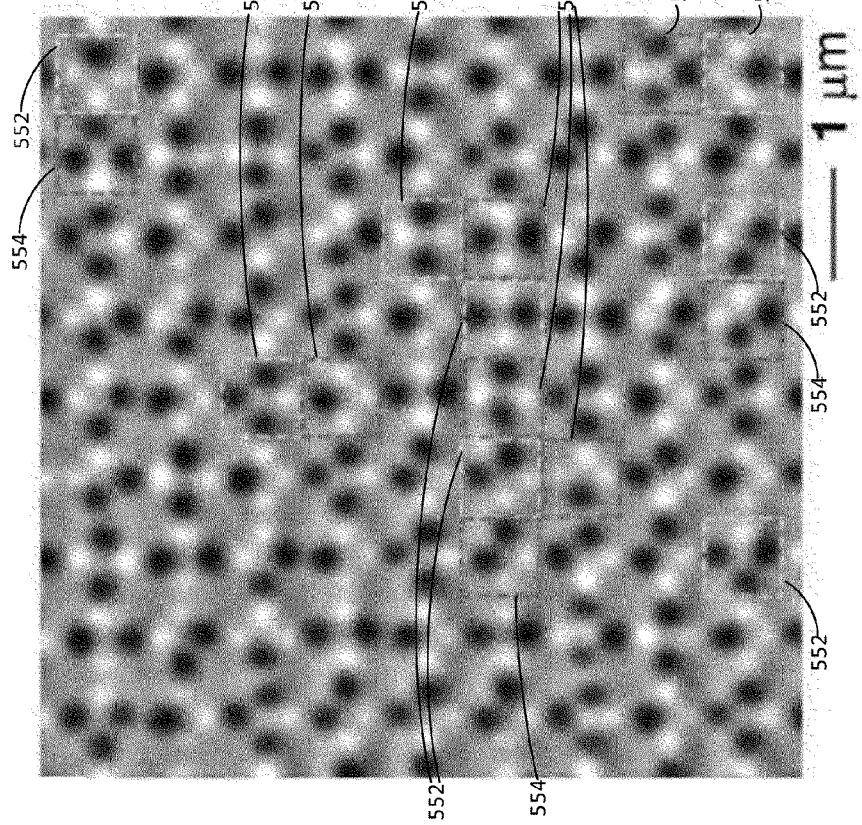

FIGS. 8A-8B depict magnetic charge/spin configurations of an as-grown sample in one implementation. FIG. 8A depicts a magnetic force microscopy image of an as-grown sample. FIG. 8B depicts the magnetic moments (arrows) extracted from FIG. 8A. Eight charge configurations are identified by the dashed square frames of M (squares 552) and N (squares 554) type plaquettes in both FIG. 8A and FIG. 8B. The corresponding charge-order configuration labels are labeled in FIG. 8B.

FIGS. 9A-9E depict a collective behavior of magnetic charge ice in one implementation. FIG. 9A and FIG. 9B MFM depict images of demagnetized states with charge spacing of (length of the nanomagnets)=300 nm (FIG. 9A) and (length of the nanomagnets)=220 nm (FIG. 9B). The two arrays of nanomagnets are patterned on the same substrate and underwent the same demagnetization process. FIG. 9C depicts calculated excitation energies of three types of charge ordering. The interaction energy is stronger for shorter island/spacing. The typical charge configurations for the respective Type-I, Type-II and Type-III states are shown next to the data points. FIG. 9D depicts population of the three types of charge configurations extracted from FIG. 9A and FIG. 9B. The predicted populations for completely free (non-interactive) islands are shown for comparison. FIG. 9E depicts normalized populations of the three charge configurations to the predicted population for non-interactive islands. A value above 1.0 corresponds to a favorable state while unfavorable states have values below 1. The favorability clearly shows an inverse relation with the calculated excitation energies given in FIG. 9C. The charge neutral Type-I configurations are strongly favored in both arrays. The Type-I ground state becomes even more favored in the array with closer charge spacing, consistent with the calculated stronger interaction energies of closer spaced charges depicted in FIG. 9C. The depiction indicates that magnetic charge ice plays a significant role in the artificial spin system.

FIGS. 10A-10I depict typical protocol steps to realize all the magnetic charge ordered states in one implementation. FIG. 10A Flipping field curves for vertical (curves 756), horizontal (curves 754) and diagonal (curves 752) islands. $H_0$-$H_8$ indicates the applied field angles and amplitudes for the eight steps shown in FIGS. 10B-10I. Eight steps are depicted to obtain the eight ordered states corresponding to FIGS. 2B-2I. FIG. 10B step 1: obtain order $I_2$ by applying magnetic field to $H_1$ and then reducing field to $H_0$ (zero field), FIG. 10O step 2: convert Type-$I_2$ to Type-$III_4$ by applying magnetic field to $H_2$ (flip vertical island's moment to 'down') and then reduce field to $H_0$ (zero field), FIG. 10D step 3: convert Type-$III_4$ to Type-$II_1$ by applying magnetic field to $H_3$ (flip horizontal island's moment to 'left') and then reduce field to $H_0$ (zero field), FIG. 10E step 4: convert $II_1$ to $III_1$ by applying magnetic field to $H_4$ (flip vertical island's moment to 'up') and then reduce field to $H_0$ (zero field), FIG. 10F step 5: convert $III_1$ to $III_3$ by applying magnetic field to $H_5$ (flip diagonal island's moment to 'left-down') and then reduce field to $H_0$ (zero field). FIG. 10G step 6: convert $III_3$ to by applying magnetic field to $H_6$ (flip vertical island's moment to 'down') and then reduce field to $H_0$ (zero field), FIG. 10H step 7: convert to $III_2$ by applying magnetic field to $H_7$ (flip horizontal island's moment to 'right') and then reduce field to $H_0$ (zero field), FIG. 10I step 8: convert $III_2$ to $II_2$ by applying magnetic field to $H_8$ (flip vertical island's moment to 'up') and then set field to $H_0$ (zero field).

FIGS. 11A-11E depict additional MFM images demonstrating the write/read/erase functions in one implementation. FIG. 11A depicts 'ANL' letters of Type-III states scribed onto a Type-I background state. FIGS. 11B-11E depicts letters patterns on the same location: FIG. 11B writing letters "ND", FIG. 11C partial erasing of letter "D", FIG. 11D adding section to partially erased "D" to form letter "I", FIG. 11E adding letter "U" to form "NIU". The letters are composed of Type-III states surrounded by a background of Type-I ground states.

FIGS. 12A-12F depicts evolution of the magnetic charge phase transition from Type-I ordering to Type-III ordering in one implementation. FIG. 12A depicts spin configurations of the transition from Type-I2 order to Type-III4 order. FIGS. 12B-12F depict MFM images delineating the gradual transition from Type-I2 order (FIG. 12B) to Type-III4 order (FIG. 12F) by applying magnetic field along 292 degree (see FIG. 2C) with increasing magnetic field amplitudes of 65 mT in FIG. 12C, 67.5 mT in FIG. 12D, 70 mT in FIG. 12E and 80 mT in FIG. 12F. The black scale bar in FIG. 12B-F is 5 μm.

Figure 13A:
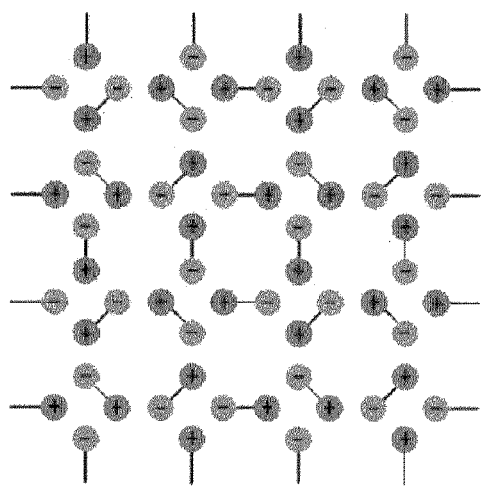
FIGS. 13A-13F depict additional designs of island arrangements for magnetic-charge patterns in some implementations.
Figure 13B:
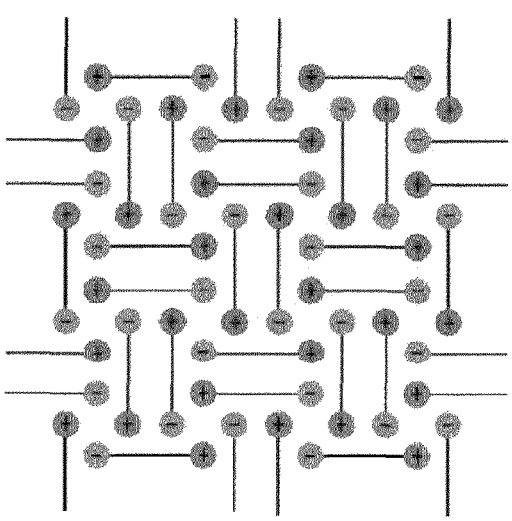
Figure 13C:
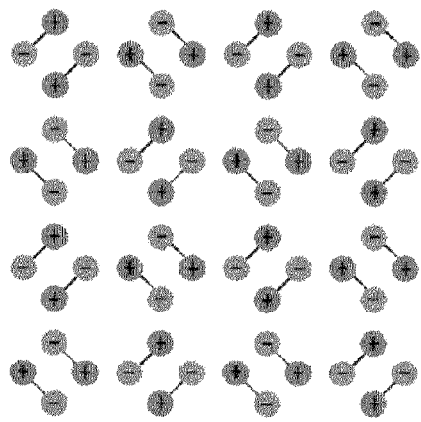
Figure 13D:
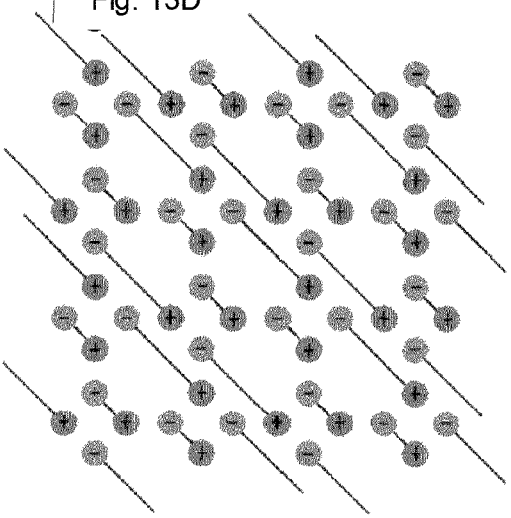
Figure 13E:
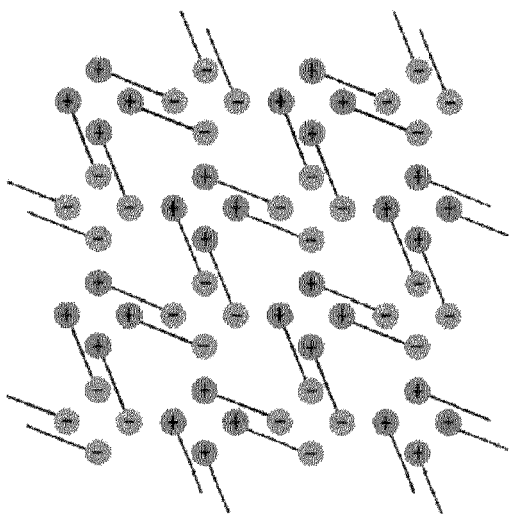
Figure 13F:
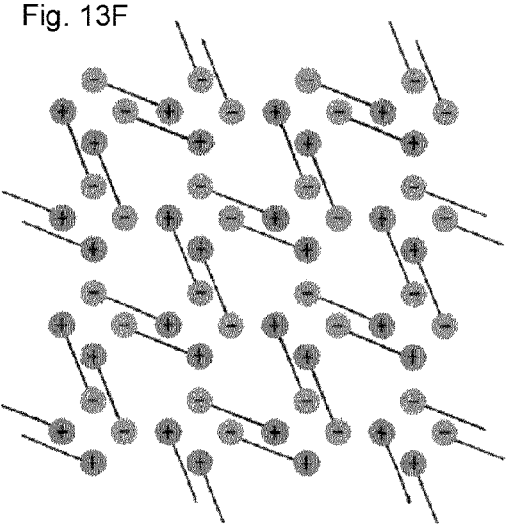

FIGS. 13A-13F depict additional designs of island arrangements for magnetic-charge patterns in one implementation. FIGS. 13A-13D depict various island arrangements maintaining the same magnetic charge distribution as that in the ground state of the spin structure presented in FIG. 1E and the square spin ice. FIG. 13E and FIG. 13F depict a proposed arrangement which can form type-IV FIG. 13E and type-II FIG. 13F magnetic charge order. Black lines connecting the positive and negative magnetic charges denote the island configurations.

In addition to the aforementioned applications on coupling with superconducting vertices and other electronic systems, this reconfigurable magnetic charge ice can provide a unique platform to explore phenomena such as the ground state of a frustrated lattice. Combined with other control parameters such as the thickness of the islands, temperature or oscillating magnetic field, some implementations of this platform provides a versatile system to study and tailor phase transitions and defect formation (depicted in one implementation in FIG. 12). For example, the single spin control, in some implementations, allows the creation of magnetic defects such as magnetic monopoles and Dirac strings at any desired locations. It also provides a direct technique to program magnetic logic circuits. Decoupling of the arrangement of spins and magnetic charges allows for further creation and exploration of exotic phases of magnetic charges, their phase transitions and fosters applications. We also note that FIG. 1E is one implementation for achieving the same magnetic charge distribution. In FIG. 13, some other implementations are depicted for several other possible designs of the spin/charge arrangements, including the Type-IV charge ordered state where all positive or negative charges are confined within a single plaquette. Furthermore, it is not necessary to keep the length of all the ferromagnetic islands the same, as recently reported in Shakti spin ices. The could also be applied, in some implementations, to other artificial spin ices to produce artificial structures with controllable magnetic charge orders, which would provide reconfigurable platforms for magnetic investigations, such as programming spin-wave band structures and designing spin-wave transmission channels.

Fabrication

In some implementations, the magnetic nano-island arrays are fabricated on $Si/SiO_2$ substrates using films of permalloy ($Ni_{0.80}Fe_{0.20}$). A lift-off technique using double layers of polymethyl methacrylates (PMMAs) is employed. First, a 495 PMMA resist layer with thickness about 80 nm is spin-coated onto the Si substrate at 2000 rpm for 45 seconds. After baking at 180° C. for 3 minutes and cooling down to room temperature, a 950 PMMA resist layer with thickness of about 100 nm is spin-coated at 2000 rpm for 45 seconds, followed by baking at 180° C. for 3 minutes. The sample is exposed to an electron-beam with a dose of 350 $\mu C/cm^2$ and energy of 30 keV. Subsequently, it is placed in a PMMA developer (MIBK:IPA ratio=1:3) for 50 seconds and in IPA for 30 seconds. An electron beam evaporator may be used to deposit a 25 nm thick permalloy film at a rate of 0.3 angstrom per second. The lift-off process is carried out in a '1165' remover at 70° C. for 2 hours, followed by 2 minutes of ultrasonic shaking. After cleaning in IPA, the process yields nanometer-scale permalloy islands with dimensions of 300 nm long, 80 nm wide and 25 nm thick on the $Si/SiO_2$ substrate. The final array size is 80 μm×80 μm with a total of 24,200 islands.

Micromagnetic Simulation

In some implementations, simulations of magnetization loops, spin flipping curves, stray field distributions and energies of various charge ordering may be carried out using the Object Oriented Micromagnetic Framework (OOMMF) Code (38). The permalloy parameters used in simulations may be: exchange constant $A=1.3\times10^{-11}$ J/m, saturation magnetization $M_S=8.6\times10^5$ A/m, magnetocrystalline anisotropy constant K=0. The cell size is 5 nm×5 nm×5 nm. The excitation energy for infinite sized sample is calculated for a 2×2 lattice of plaquettes under 2D periodic boundary conditions for both the designed spin structure and the corresponding square spin ice structure. The stray field distribution is also calculated under 2D periodic boundary conditions.

MFM Imaging

For some implementations, the experiments were conducted in a custom designed and built MFM system placed in a 2D electromagnet. The magnetic charge imaging and manipulation were implemented using a commercial MFM probe (NANOSENSORS™ PPP-MFMR), where the tip was vertically magnetized. To avoid inadvertent flipping of the magnetic island's moment, a constant height scanning method was used for MFM imaging with the scanning plane set at 100 nm above the sample. All MFM images were obtained in zero applied field.

Manipulation of the Magnetic Charge Ordering with Magnetic Field in Some Implementations FIG. 7A shows, in one implementation, a typical calculated magnetization loop of a ferromagnetic island. When the applied magnetic field is larger than the flipping field, $H^f$, the island switches its spin direction. Since the value of $H^f$ depends on the applied field direction, as shown in FIG. 7 in one implementation, it is possible to selectively control the switching of the spin moments of the islands placed in different orientations by tuning the angle and amplitude of the applied field. In FIG. 7C, the angle dependence is plotted of the flipping fields for the three subsets of islands/spins in polar coordinate.

To realize a specific configuration of charge order, the flipping field curves are depicted in FIGS. 7A-7C for some implementations. When the applied magnetic field crosses the flipping field curve of the islands in a specific orientation, the moment of the corresponding islands will flip if it initially points in the opposite direction with respect to the applied field. Procedures are presented to obtain all eight charge configurations in FIGS. 10A-10I. The magnetic moments of the vertical and horizontal islands can be simply flipped by applying an in-plane field to $H_2/H_{4,8}$ and $H_3/H_7$, respectively, as shown in FIG. 10A. Flipping the diagonally oriented islands requires a two-step procedure because there is no direct pathway to apply a field that only crosses the flipping curve of the diagonally oriented islands (curve 452 in FIG. 7C and curve 752 in FIG. 10A). The method, in some implementations, is to flip both the diagonal islands and one set of the horizontal or vertical islands first, and then flip the latter back. For example, in FIG. 10A, applying a field to $H_5$ will flip the spins of both the diagonal islands and the horizontal islands, and then applying a field to $H_7$ will flip the moment of the horizontal islands back to its original direction, with the final result of only flipping the moment of the diagonal islands.

Sample Demagnetization

In some implementations, in-plane magnetic field rotating at 20 rpm starts at 1000 Oe (above the coercive field of the islands) and gradually reduces to zero in steps of 0.1 Oe at a rate of 3.33 steps per second (300 ms/step). A small AC field of 5 Oe is superimposed at a higher rotation rate of 100 rpm to assist the fluctuation of the macrospins.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. An artificial spin structure in which one can obtain multiple long-range orderings of a magnetic charge ice lattice at room temperature comprising:
   a square lattice of plaquettes comprising ferromagnetic islands, the ferromagnetic islands comprising at least one ferromagnetic island in a horizontal, vertical, and diagonal orientation.

2. The artificial spin structure of claim 1, wherein each plaquette of the square lattice of plaquette has three macro Ising spins associated with each plaquette.

3. The artificial spin structure of claim 2, wherein the three macro Ising spins associated with each plaquette are each associated with respective ferromagnetic islands of each plaquette, the respective ferromagnetic islands comprising ferromagnetic islands in a horizontal, vertical, and diagonal orientation.

4. The artificial spin structure of claim 1, wherein a first plurality of the plaquettes of the square lattice of plaquettes are rotated 180° from a second plurality of the plaquettes of the square lattice of plaquettes based on the ferromagnetic islands of each respective plaquette.

5. The artificial spin structure of claim 1, wherein the ferromagnetic islands of the square lattice of plaquettes comprising ferromagnetic islands each have a binary degree of spin freedom.

6. The artificial spin structure of claim 1, wherein each plaquette of the square lattice of plaquettes comprises eight potential configurations of magnetic charges based on each plaquette comprising a ferromagnetic island in a horizontal orientation, a ferromagnetic island in a vertical orientation, and a ferromagnetic island in a diagonal orientation.

7. The artificial spin structure of claim 1, wherein the artificial spin structure is athermal at room temperature.

8. The artificial spin structure of claim 4, wherein for a given ferromagnetic island, a minimal strength of an applied magnetic field required to flip a spin moment of the given ferromagnetic island changes with the angle between the applied magnetic field and the given ferromagnetic island.

9. The artificial spin structure of claim 4, wherein the ferromagnetic islands of the square lattice of plaquettes comprising ferromagnetic islands each have a binary degree of spin freedom.

10. The artificial spin structure of claim 1, wherein the ferromagnetic islands are permalloy on a $Si/SiO_2$ substrate.

11. The artificial spin structure of claim 1, wherein a spin moment of each of the ferromagnetic islands oriented in the horizontal, the vertical, and the diagonal orientations are magnetized along the same direction.

12. The artificial spin structure of claim 1, wherein the eight potential configurations of magnetic charges can be separated into three groups based on their energies, the three groups comprising a two-fold degenerate ground state, a two-fold degenerate excited state, and a four-fold degenerate excited state.

13. The artificial spin structure of claim 11, wherein each of the three groups possess long range ordering and can be reproduced over an entirety of the square lattice of plaquettes.

14. The artificial spin structure of claim 11, wherein the two-fold degenerate ground state and the two-fold degenerate excited state results in no net charge on the any plaquette in those states.

15. The artificial spin structure of claim 13, wherein there is an effective magnetic charge of two on a plaquette in the four-fold degenerate excited state.

16. A method of altering the artificial spin structure of claim 1 to perform at least one of a write function, a read function, or an erase function, the method comprising:
   preparing the artificial spin structure in a ground state by applying and zeroing an in-plane magnetic field along the diagonal direction; and
   altering at least one of a plurality of ferromagnetic islands using a 2D vector magnet.

17. The method of claim 16, wherein altering at least one of the plurality of ferromagnetic islands using the 2D vector magnet comprises applying a magnetic field to alter a spin moment of the at least one of the plurality of ferromagnetic islands.

18. The method of claim 17, wherein altering at least one of the plurality of ferromagnetic islands using the 2D vector magnet comprises applying a magnetic field to alter a spin moment of the at least one of the plurality of ferromagnetic islands to change a state of a plaquette containing the at least one of the plurality of ferromagnetic islands to a two-fold degenerate ground state.

19. The method of claim 17, wherein altering at least one of the plurality of ferromagnetic islands using the 2D vector magnet comprises applying a magnetic field to alter a spin moment of the at least one of the plurality of ferromagnetic islands to change a state of a plaquette containing the at least one of the plurality of ferromagnetic islands to a two-fold degenerate excited state.

20. The method of claim 17, wherein altering at least one of the plurality of ferromagnetic islands using the 2D vector magnet comprises applying a magnetic field to alter a spin moment of the at least one of the plurality of ferromagnetic islands to change a state of a plaquette containing the at least one of the plurality of ferromagnetic islands to a four-fold degenerate excited state.

* * * * *